United States Patent [19]
Yim et al.

[11] Patent Number: 5,109,361
[45] Date of Patent: Apr. 28, 1992

[54] ELECTRICALLY PAGE ERASABLE AND PROGRAMMABLE READ ONLY MEMORY

[75] Inventors: Hyeong-Kyu Yim; Woong-Mu Lee, both of Seoul, Rep. of Korea

[73] Assignee: SamSung Electronics Co., Ltd., Kyung Ki-Do, Rep. of Korea

[21] Appl. No.: 460,737

[22] Filed: Jan. 4, 1990

[30] Foreign Application Priority Data

Nov. 30, 1989 [KR] Rep. of Korea ......... 1989-17672[U]

[51] Int. Cl.⁵ ..................... G11C 16/04; G11C 8/00
[52] U.S. Cl. ............................. 365/218; 365/185; 365/230.03; 365/238.5
[58] Field of Search ............. 365/185, 230.03, 230.06, 365/210, 218, 104, 238.5; 357/23.5

[56] References Cited

U.S. PATENT DOCUMENTS

| | | | |
|---|---|---|---|
| 4,266,283 | 5/1981 | Perlegos | 365/104 |
| 4,384,349 | 5/1983 | McElroy | 365/218 |
| 4,527,256 | 7/1985 | Giebel | 365/189.06 |
| 4,677,590 | 6/1987 | Arakawa | 365/210 |
| 4,698,787 | 10/1987 | Mukherjee et al. | 365/104 |
| 4,719,598 | 1/1988 | Stockton | 365/189.03 |
| 4,949,309 | 8/1990 | Rao | 365/218 |
| 4,996,571 | 2/1991 | Kume et al. | 365/218 |

FOREIGN PATENT DOCUMENTS

| | | | |
|---|---|---|---|
| 0184795 | 8/1986 | Japan | 365/238.5 |
| 0248000 | 10/1988 | Japan | 365/238.5 |

*Primary Examiner*—Stuart N. Hecker
*Assistant Examiner*—Jack A. Lane
*Attorney, Agent, or Firm*—Bushnell, Robert E.

[57] ABSTRACT

An electrically page erasable and programmable read only memory device is an EEPROM device which is erasable page by page, and consists of flash-type floating gate transistors as the memory cells. The memory cell array of the device is divided by a plurality of pages, wherein each page comprises a plurality of bit lines, a plurality of common source lines, and a plurality of word lines. A plurality of erase selection circuits are arranged and correspond to the respective pages in order to erase the cells in a selected page, wherein each erase selection circuit comprises a passing transistor, a gate, a voltage stabilizing transistor, and an erasing line.

16 Claims, 11 Drawing Sheets

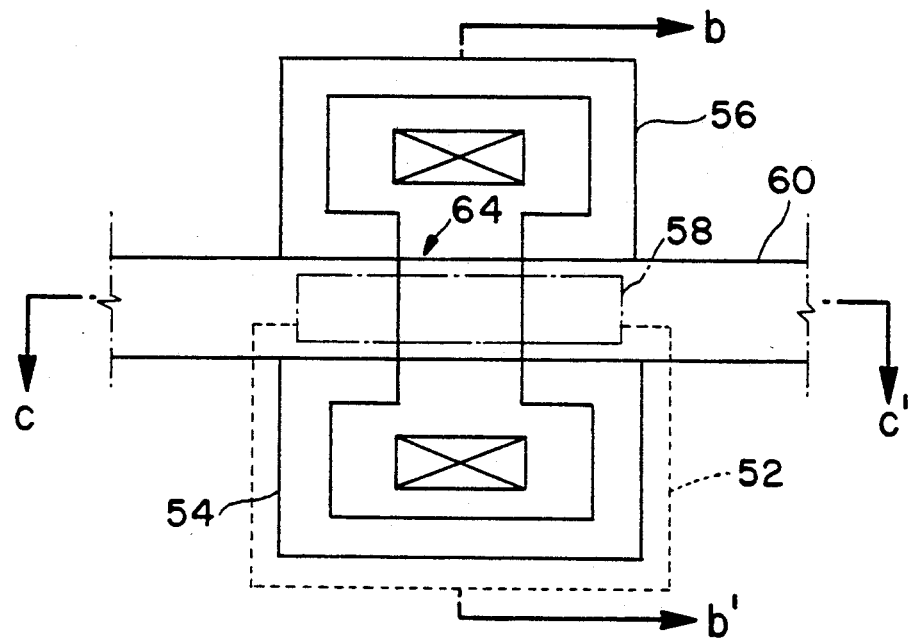
FIG. IA PRIOR ART
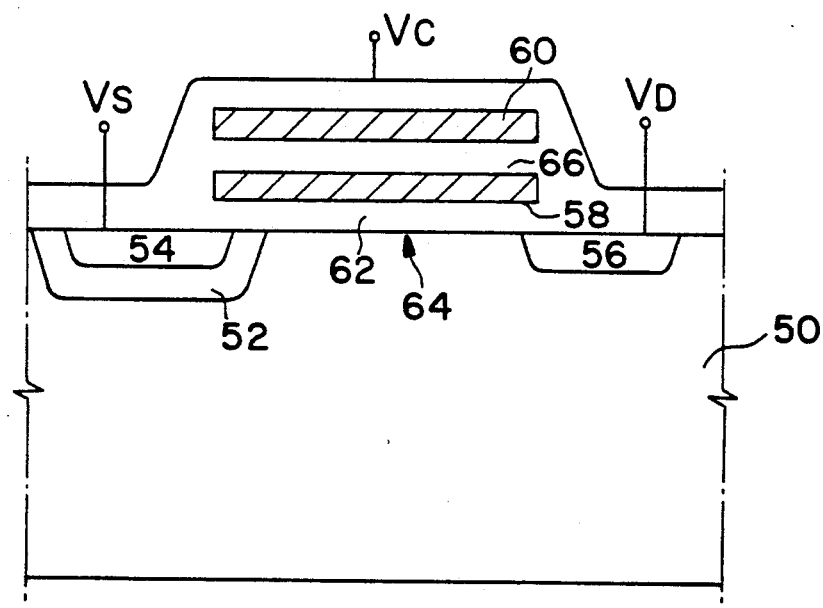
FIG. IB PRIOR ART

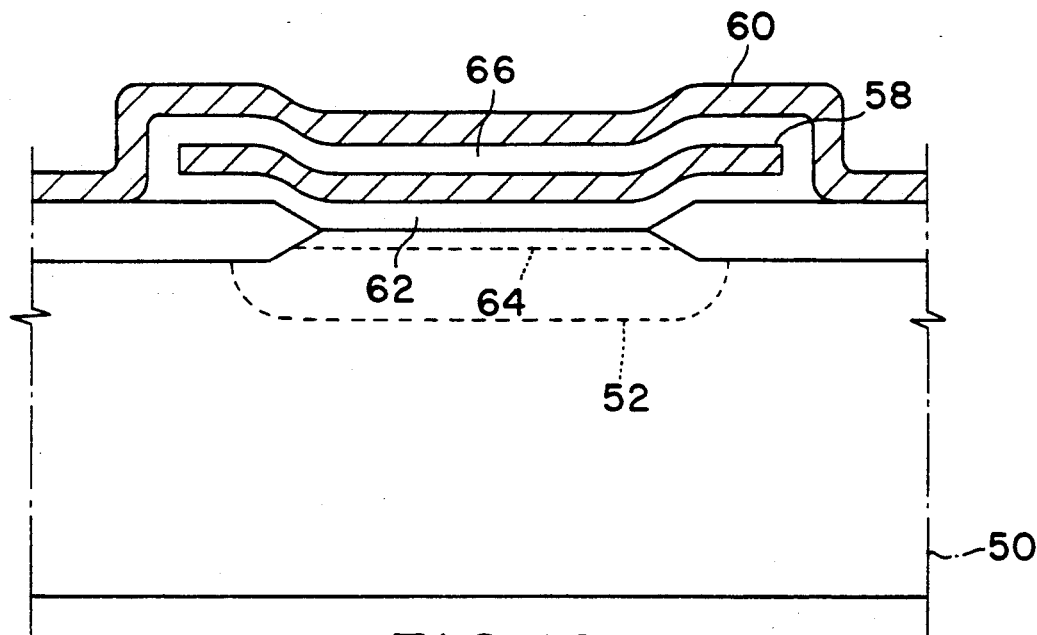
FIG. IC PRIOR ART
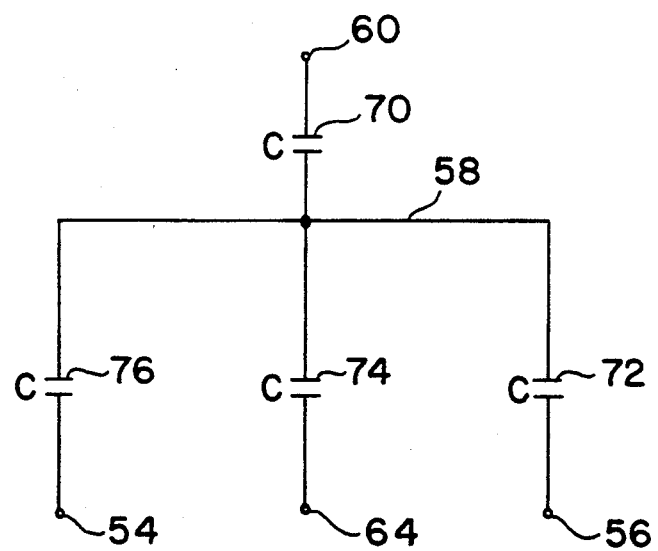
FIG. ID PRIOR ART

ELECTRICALLY PAGE ERASABLE AND PROGRAMMABLE READ ONLY MEMORY

BACKGROUND OF THE INVENTION

The present invention relates to an electrically erasable and programmable read only memory (hereinafter referred to as EEPROM), more particularly, to an electrically page erasable and programmable read only memory device having a plurality of flash-type floating gate transistors.

The EEPROM is a read only memory which is electrically erasable and programmable owing to the electrical characteristics of EEPROM cells in an array. Floating gate tunnel oxide (FLOTOX) type transistors erased by exposure to ultraviolet light and flash-type floating gate transistors are all used as the EEPROM cells. The structure of the flash-type floating gate transistor is similar to the structure of the FLOTOX-type transistor in that it has a two-layer polysilicon gate but is dissimilar thereto in that the edges of the source region and the drain region overlap the floating gate which underlies the thin gate oxide layer.

The FLOTOX-type transistor used as the EEPROM cell is programmable in the manner of the tunneling of electrons which drift to the floating gate from the drain through an approximately 100 Å tunnel oxide layer, and it is erasable in the manner of the tunneling of electrons which drift from the floating gate to the source through the approximately 100 Å tunnel oxide layer.

A basic technology relating to the above mentioned FLOTOX-type transistor, is disclosed in U.S. Pat. No. 4,203,158 of Intel.

Referring now to an array using the FLOTOX-type transistors, since all of the drains are interconnected with a common bit line, high voltage is applied to all drains including unwanted drains. Therefore, another transistor called a selection transistor is used for selecting only the desired cells. Accordingly, in the EEPROM device which uses FLOTOX-type floating gate transistors as memory cells, two transistors are required for a bit or a cell, so that the manufacture of the high density integrated EEPROM device is difficult.

On the other hand, the flash-type floating gate transistor as described hereinabove has a structure in which the edges of a source region and a drain region overlap a floating gate with a thin tunnel oxide layer therebetween, as illustrated in FIGS. 1A to 1D.

FIG. 1A shows a plane view of the flash-type floating gate transistor. FIG. 1B and FIG. 1C are cross sectional views respectively taken along lines b—b' and c—c' of the FIG. 1A, and FIG. 1D is an equivalent circuit diagram. In FIG. 1A, a source diffusion region 52, the source region 54 and drain region 56, a floating gate 58 formed of polysilicon, a control gate 60 formed of polysilicon and a channel region 64 which is defined by the source region 54 and the drain region 56, are illustrated.

In FIG. 1B, a semiconductor substrate 50, the source diffusion region 52, the source region 54, the drain region 56, the control gate 60 formed of polysilicon, the floating gate 58 formed of polysilicon, the channel region 64, a tunnel oxide layer 62 between the channel region 64 and the floating gate 58, and an oxide dielectric layer 66 between the control gate 60 and the floating gate 58, are illustrated.

In FIG. 1C, the semiconductor substrate 50, the source diffusion region 52, the tunnel oxide layer 62, the control gate 60, the floating gate 58 and the oxide dielectric layer between the control gate 60 and the floating gate 58, are illustrated.

FIG. 1D is an equivalent circuit diagram of the flash-type floating gate transistor, wherein a capacitive coupling 70 between the control gate 60 and the floating gate 58, the capacitive coupling 76 between the floating gate 58 and the source region 54, the capacitive coupling 72 between the floating gate 58 and the drain region 56, and the capacitive coupling 74 between the floating gate 58 and the channel region 64, are illustrated.

Referring now to FIG. 1B, erasing, programming and reading operations of the EEPROM, which is composed of the flash-type floating gate transistors, will be described.

When the flash-type floating gate transistor is used for the memory cell, an erase line is connected to the source region 54, a bit line to the drain region 56, and a word line to the control gate 60.

The erasing operation of the EEPROM is achieved by increasing the potential of the source 54 (or the erase line) to 12 volts, earthing the control gate 60 (or the word line) and floating the drain 56 (or the bit line). With Fowler-Nordheim tunneling, electrons drift from the floating gate 58 to the source 54 through the tunnel oxide layer 62. At this time, the threshold voltage of the transistor is reduced to about 1-2 volts.

The programming operation is achieved by applying high voltage to the drain 56 of the cell. Practically, it is achieved by applying about 7 volts to the drain region 56 and 12 volts to the control gate 60, while hot electrons are generated in the depletion region which is between the drain 56 and the channel 64 and they are injected to the floating gate 58, this increases the threshold voltage of the transistor to 6-7 volts.

On the other hand, the reading operation is achieved by applying 5 volts to the control gate 60 and 1.5 volts to the drain region 56, and then by sensing channel current which flows to the source 54 from the drain 56 of a programmed cell or an erased cell.

When using such a flash-type floating gate transistor as stated above, only one transistor is needed in a bit, and all of the cells are erasable at one time, unlike the array using the FLOTOX-type transistors. Such an array of the EEPROM using the flash-type transistors as the cells is disclosed in U.S. Pat. No. 4,698,787 obtained by the Exel Microelectronics, Inc.

This patent is for the art by which memory cells in an array are erasable block by block or byte by byte. It is illustrated in FIG. 2, FIG. 3 and FIG. 4, wherein FIG. 2 is a schematic diagram of all memory cells of said patent, FIG. 3 is an inner circuit diagram of FIG. 2 when a block-erasable operation is carried out, and FIG. 4 is an inner circuit diagram of another embodiment of said patent when a byte-erasable operation is carried out.

Referring to a construction of the EEPROM chip of said patent illustrated in FIG. 2, pages $PG_1$-$PG_N$ are arranged in the left side of a row address decoder 81 positioned in the center of the chip and pages $PG_{N+1}$-$PG_{2N}$ are arranged in the right side of the row address decoder 81, and each of pages $PG_1$-$PG_{2N}$ owns a plurality of column lines, a plurality of word lines, and a plurality of the cells which are connected to those lines. The number of the cells are obtained by multiplying the number of the column lines and the number of the word lines.

The column lines of a page are connected in common to one of the input/output (I/O) lines of a column address decoder 83. When the number of the pages is 2n, the I/O lines of column address decoder 83 are 2n in number and are labeled $I/O_1, I/O_2, ..., I/O_{2N}$. At this time, $I/O_1$ is connected to the common column line of $PG_1$, $I/O_2$ to the common column line of $PG_2$, and $I/O_{2N}$ to the common column line of $PG_{2N}$. The I/O lines from column address decoder 83 for column selection and a common erase line 11 for erasing operation are connected to all of the pages.

FIGS. 3 and 4 are embodiments of 2, representing the formation of an array of the memory cells. In FIGS. 3 and 4, for the convenience of description, the number of the I/O lines is eight.

The cells in the array illustrated in FIG. 3 are the EEPROM cells which are block-erasable. The control gates of the cells in a row are connected in common to the word line of the same row. The drains of the cells in a column are connected in common to the bit line (or I/O line) of the same column. The sources of the cells in a row are connected in common to the common source line of the same row. Since the erase line 11 is coupled in common to all of the common source lines $CS_1-CS_K$, erasing voltage is applied to all of the common source lines $CS_1-CS_K$ through the erase line 11.

FIG. 4 shows an array of the EEPROM cells which is byte-erasable. The control gates of the cells in a row are connected in common to the word line of the same row. The drains of the cells in a column are connected in common to the bit line of the same column. The sources of the cells in a row are connected in common to the common source line of the same row. The array in FIG. 4 differs from the array in FIG. 3 in that the N-channel metal oxide semiconductor (NMOS) transistors which are positioned one by one in the right end of each row, are used for the byte-erasing operation. The sources of the NMOS transistors are connected respectively to the respective common source lines and the gates of the NMOS transistors are connected respectively to the respective word lines, while the drains of all the NMOS transistors are coupled in common to the erase line 11. That is, in the array of FIG. 3, as the erasing voltage through the erase line 11 is applied to all of the common source lines in a block, all of the cells in a block are erasing at one time. In the array of FIG. 4, however, since the erasing voltage through the erase line 11 is only applied to a selected common source line, only the cells in a row are erased at one time.

As the erasing operation is achieved by applying high voltage to the erase line 11 and by grounding all of the word lines, all of the memory cells of a chip are erased at one time, which causes unrequired cells to be erased. It is because when high voltage is applied to the erase line 11 in the erasing operation, the source 54 of FIG. 1B has been formed within the source diffusion region 52 of FIG. 1B with them not separated. Thus, erasing of all of the memory cells occurs at the same time. In this case, the access time of all memory cells will be delayed because resistance of corresponding grounding parts increases accordingly as the drain voltage controlling the access time of the memory cells increases. As it is difficult for all of the memory cells to be fabricated under the same conditions, the access times of all of the memory cells are not equal. In this case, the total time required to access all of the memory cells is determined by the longest access time. For example, when the access time of one of the memory cells is 100 ns and the access time of another memory cell is 140ns, the total time required to access two memory cells is 140ns.

Therefore, an increase of parasitic resistance due to the high density integration of memory device and the access time of the memory cells must be considered.

SUMMARY OF THE INVENTION

It is therefore an object of the present invention to provide a method for forming an array of electrically erasable and programmable read only memory cells using flash-type transistors (flash-type EEPROM) which can decrease source voltage loss caused by an increase of grounding resistance of grounded sources by means of properly arranging I/O lines.

It is another object of the present invention to provide a flash-type EEPROM device which is page-erasable.

It is still another object of the present invention to provide a method and a circuit which can apply erasing voltage to every page of the flash-type EEPROM, holding optimized threshold voltage.

It is a further object of the present invention to provide a memory device which can minimize an area of a memory chip by strapping all lines.

In order to accomplish the above objects and other objects of the present invention, an EEPROM cell array of the present invention includes:

a plurality of floating gate transistors having sources, drains and floating gates, arranged in a structure of a matrix;

a plurality of word lines connected respectively to the control gates of the transistors in the same rows;

a plurality of bit lines connected respectively to the drains of the transistors in the same columns and divided by a first group and a second group;

an erase line connected in common to the common source lines;

first selection means for selecting the first group to enable write operation and read operation of the cells only in the first group to be performed; and second selection means for selecting the second group to enable write operation and read operation of the cells only in the second group to be performed.

According to another aspect of the present invention, the memory device of the present invention includes a plurality of erase selection circuits, connected respectively to each page, for providing erasing voltage of the desired pages by buffering inputted erasing voltage.

According to still another aspect of the present invention, the present invention includes:

a logic gate whose two input terminals receive an erase enable signal and a signal from a column address decoder, for outputting an erase selection signal;

a pass transistor with its gate connected to the terminal of a power source voltage and its source connected to the output terminal of the logic gate, for passing the output of the logic gate 410 without degradation;

gating means which is supplied by erasing voltage, for outputting the erasing voltage when the logic state of the output of the logic gate is low;

voltage stabilizing means whose three terminals are coupled to the input node of the gating means, the output node of the gating means and the erasing voltage supplier, for stabilizing a potential difference between both ends of the gating means; and an erasing line which transmits the output of the gating means into the common source lines.

BRIEF DESCRIPTION OF THE INVENTION

For a better understanding of the present invention and to show how the same may be carried into effect, reference will be made, by way of example, to the accompanying diagrammatic drawings, in which:

FIG. 1A is a plane view of a flash-type floating gate transistor.

FIG. 1B is a cross sectional view taken along line b—b' of FIG. 1A.

FIG. 1C is a cross sectional view taken along line c—c' of FIG. 1A.

FIG. 1D is an equivalent circuit of a flash-type floating gate transistor.

DETAILED DESCRIPTION OF THE PREFERRED EMBODIMENT

Figure 2:
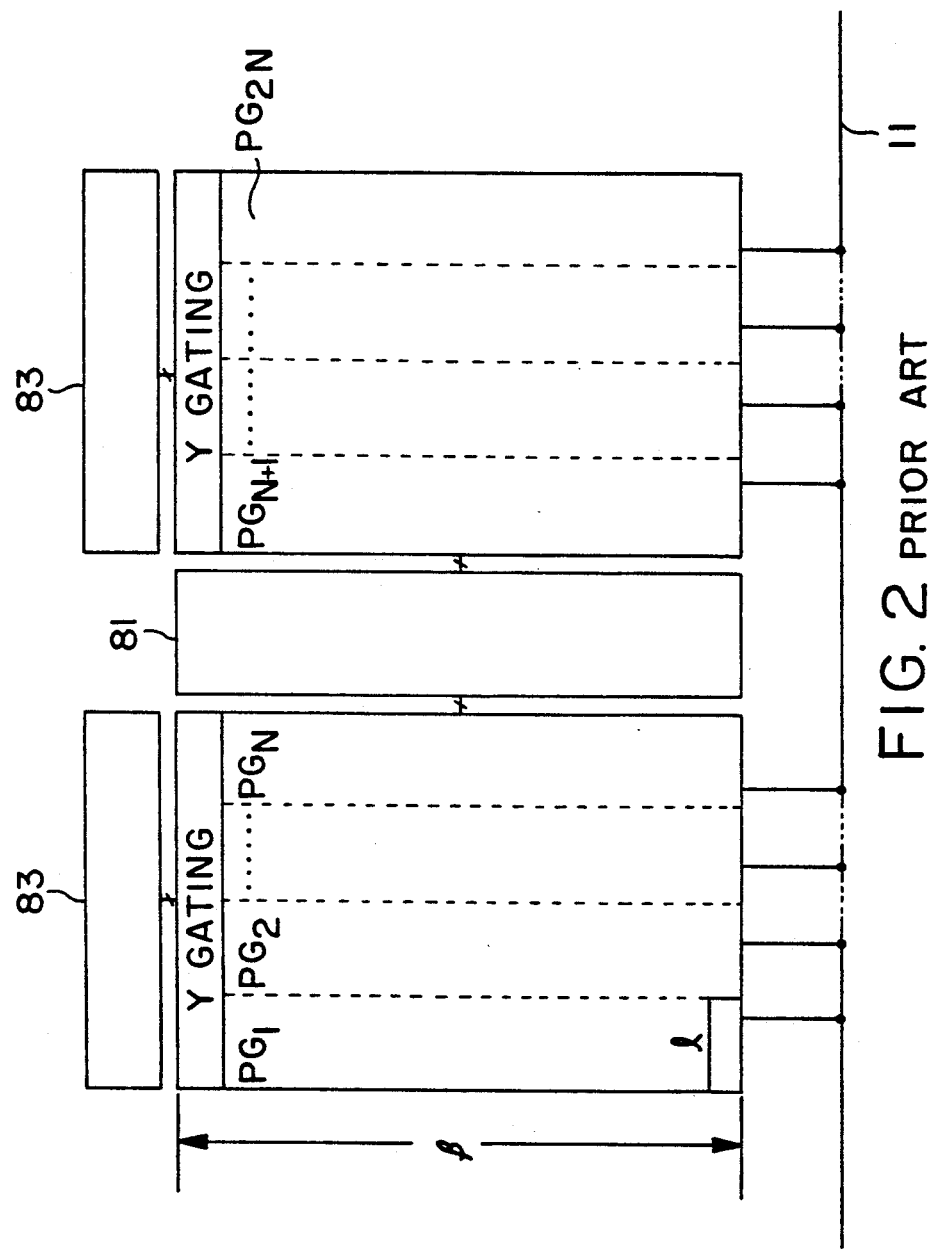
FIG. 2 is a schematic diagram of a conventional array.
Figure 3:
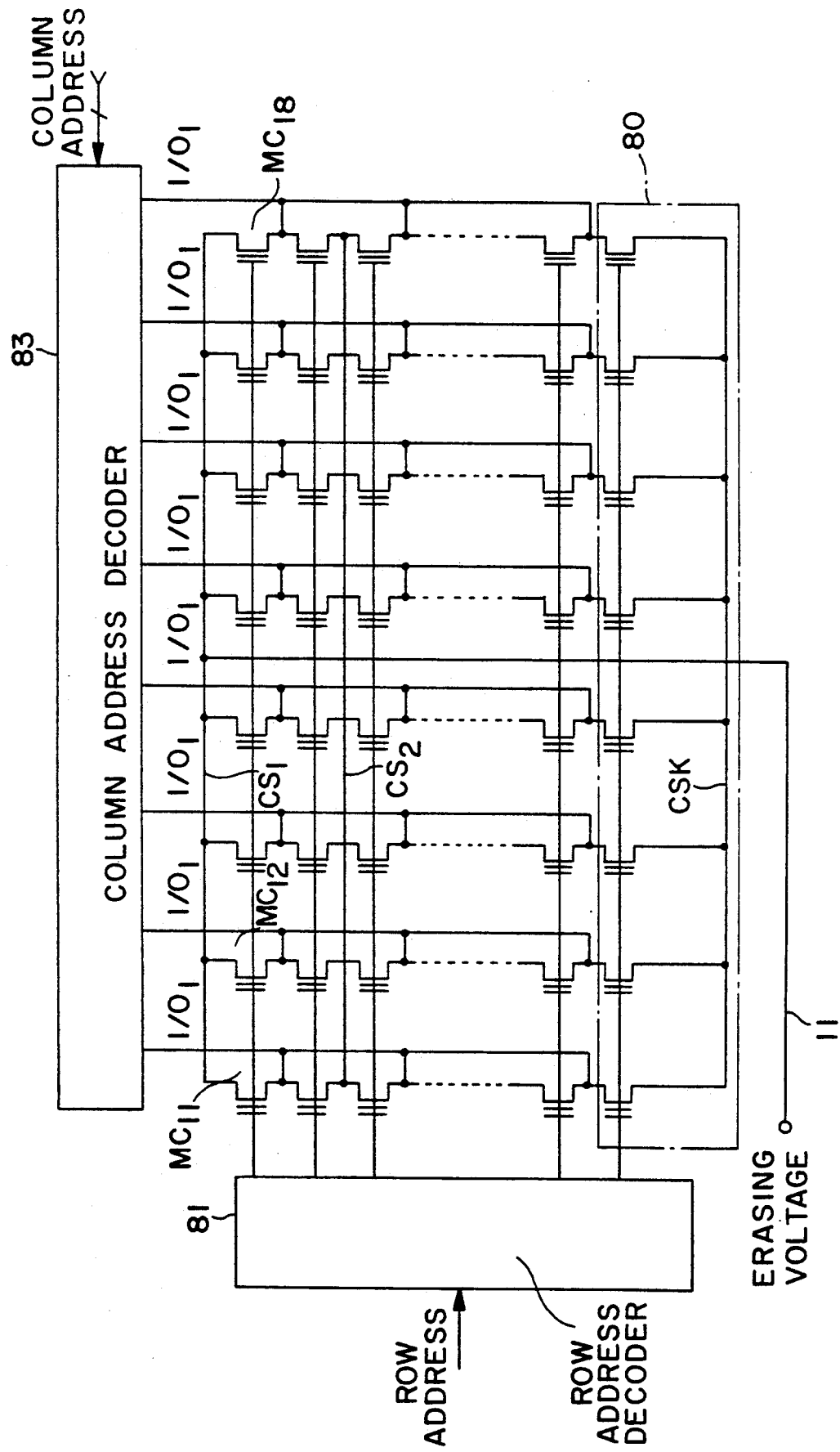
FIG. 3 is an inner circuit diagram of FIG. 2.
Figure 4:
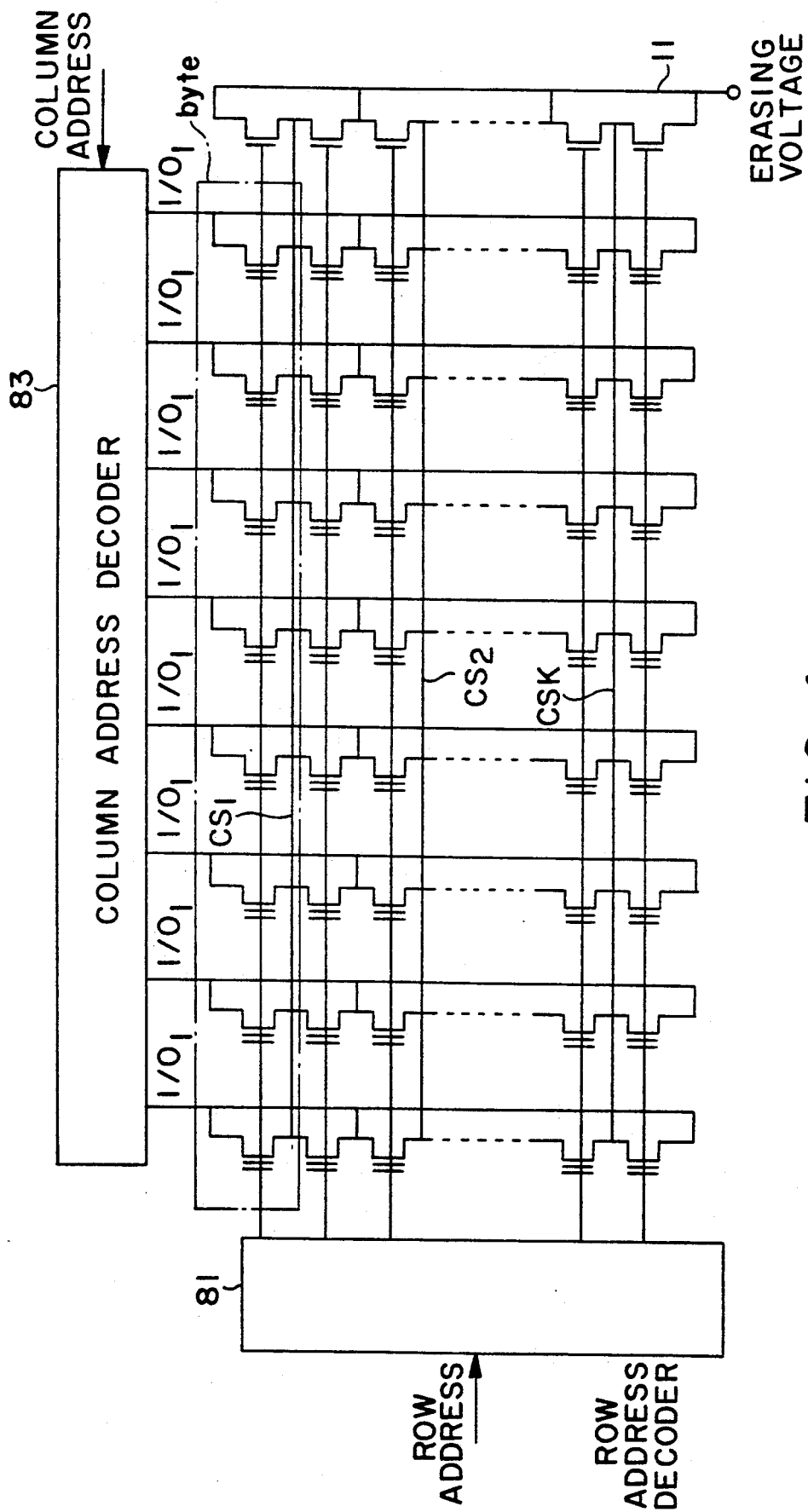
FIG. 4 is a circuit diagram of another conventional memory array.
Figure 5:
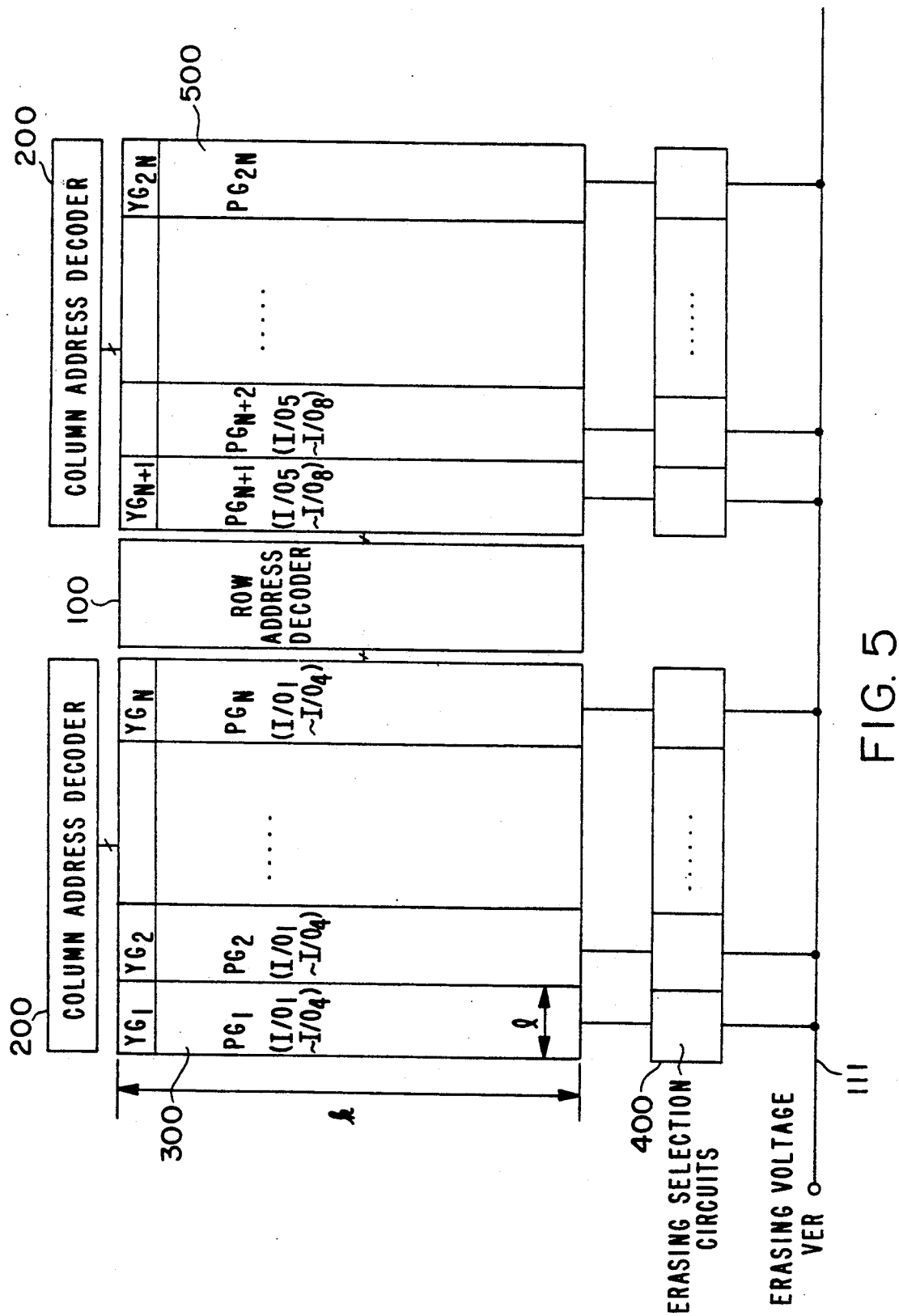
FIG. 5 is a schematic diagram of the array of the present invention.

FIG. 5 is a schematic diagram of the array of the present invention. It is taken as an example in which the number of input/output terminals (hereinafter referred to as I/O terminal) is eight. In FIG. 5, the first four I/O terminals $I/O_1$-$I/O_4$ of pages $PG_1$-$PG_N$ are arranged in the left side of a row address decoder 100 and the remaining four I/O terminals $I/O_5$-$I/O_8$ of pages $PG_{N+1}$-$PG_{2N}$ are arranged in the right side thereof.

Each page with a matrix structure owns K word lines (or row lines), I column lines and I pieces of Y gating means $YG_1$-$YG_{2N}$ which select one of the pages $PG_1$-$PG_{2N}$ and are connected directly to the output of a column address decoder 200. Each output from the erasing selection circuits 400 is coupled to the corresponding page, and the respective inputs of the erase selection circuits 400 are connected in common to erase line 111 for being supplied by the erasing voltage.

Figure 6:
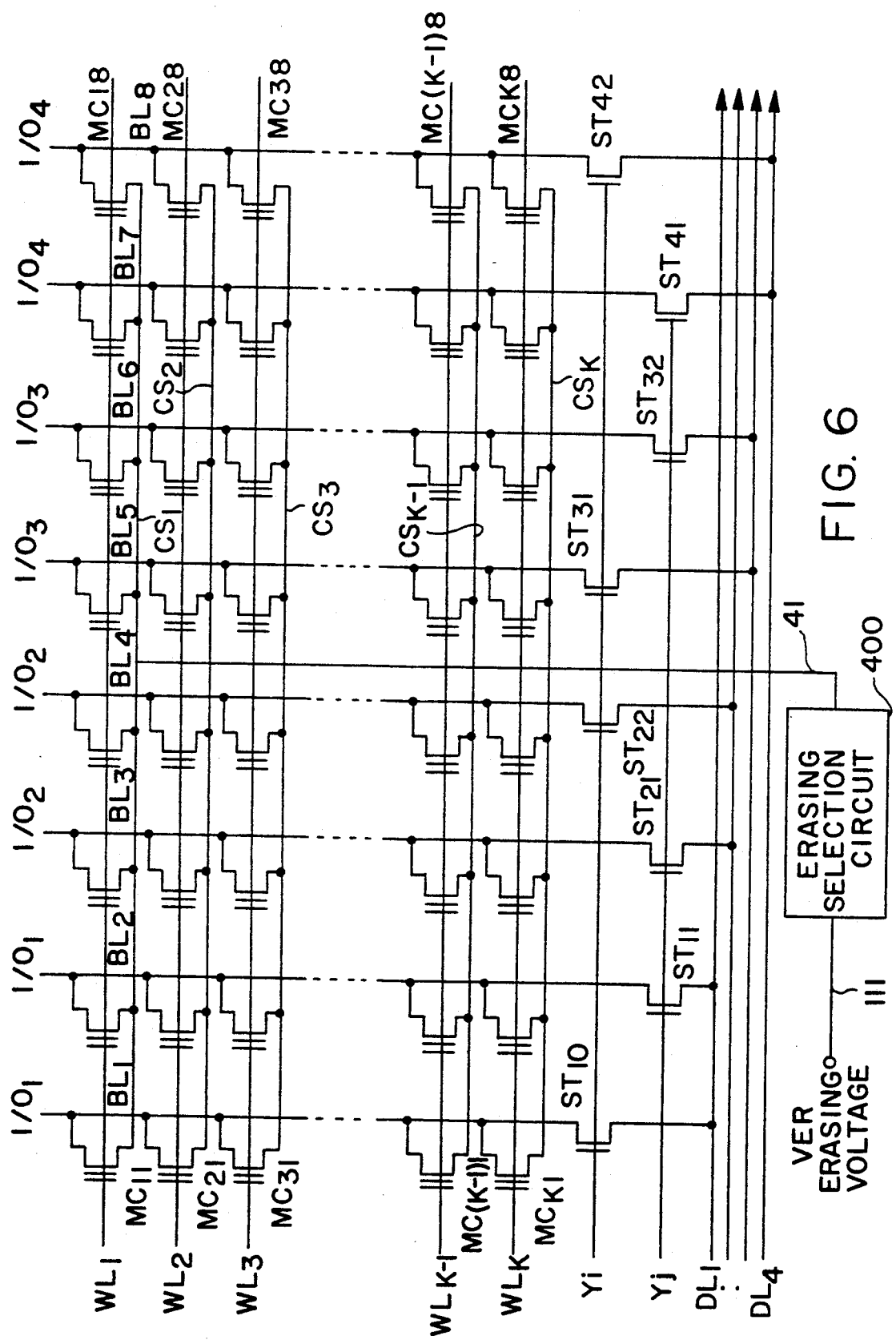
FIG. 6 is an inner circuit diagram showing an embodiment of FIG. 5.

FIG. 6 illustrates the array of the first page PG1 having eight column lines (I/O lines or bit lines) in FIG. 5. The inner circuit of FIG. 6, composed of 8×K pieces of the flash-type transistors $MC_{11}$-$MC_{K8}$, includes:

eight common bit lines $BL_1$-$BL_8$ or eight column lines which are connected to four I/O terminals $I/O_1$, $I/O_2$, $I/O_3$, $I/O_4$ by two bit lines, an I/O terminal, and each of them is coupled to the drain junction of the cells in a corresponding column;

K word lines $WL_1$-$WL_K$, each line coupled in common to the gates in a corresponding row;

Y gating means YG1 having eight transistors of which the gates are connected to two lines from the column address decoder 200, for selecting wanted bit lines and transmitting data through data lines $DL_1$-$DL_4$ into the memory cells in the selected bit lines by operating the transistors in the Y gating means; and an erasing selection circuit 400 for supplying erasing voltage VER to the common source lines $CS_1$-$CS_K$ of all of the memory cells $MC_{11}$-$MC_{K8}$ through the erase line 41.

Figure 7:
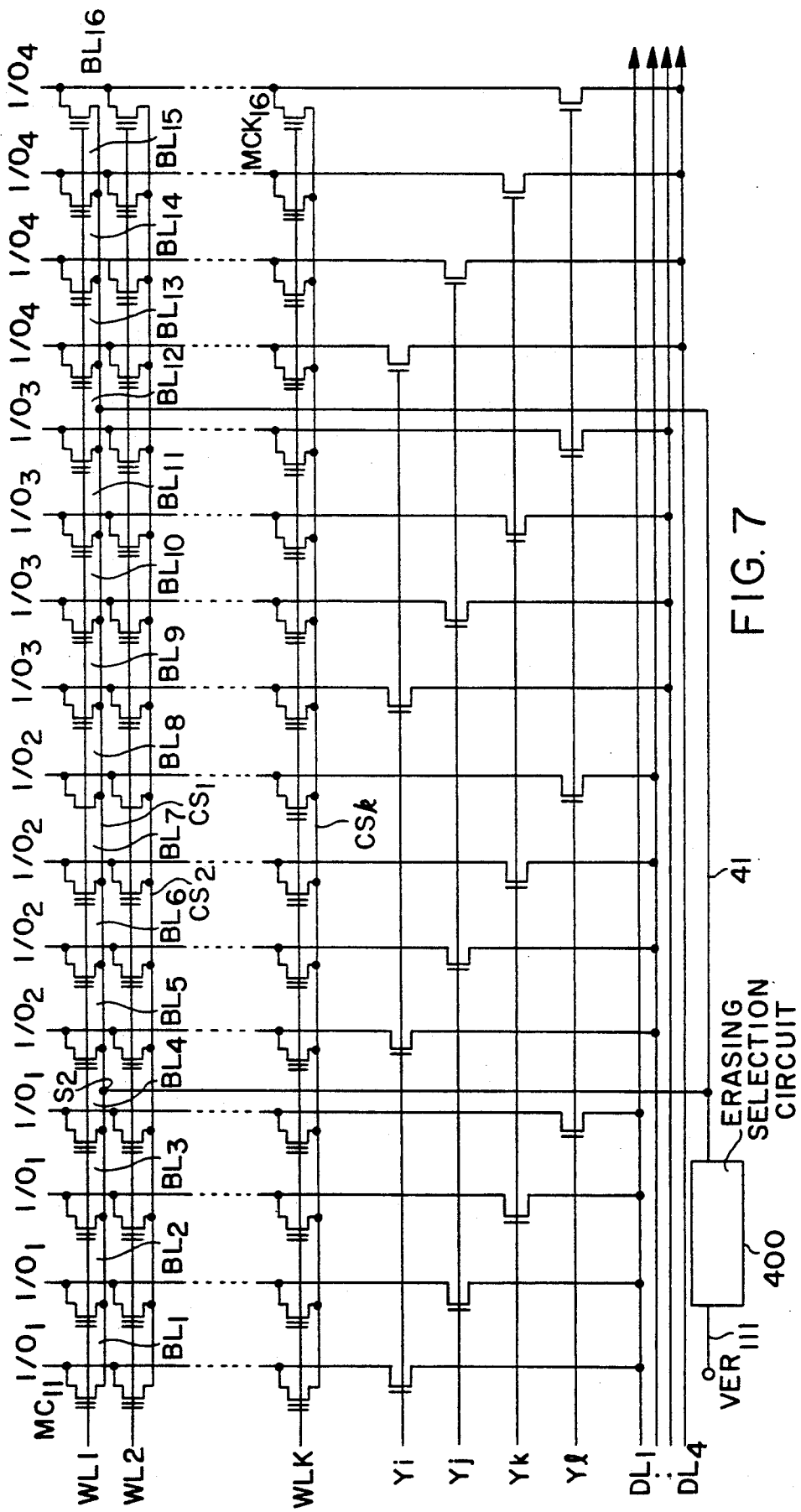
FIG. 7 is an inner circuit diagram showing another embodiment of FIG. 5.

FIG. 7 illustrates the inner circuit of the first page PG1 of FIG. 5 wherein one page has sixteen common column lines (or bit lines). Although the number of the common bit lines is eight in FIG. 6, it is sixteen in FIG. 7. Furthermore, four it lines are connected in common to one of the I/O terminals in FIG. 7. Accordingly, the Y gating means has four lines Yi, Yj, Yk, Yl from the column address decoder 200. The output of the erase selection circuit 400 provides the erasing voltage with the common source lines.

Figure 8:
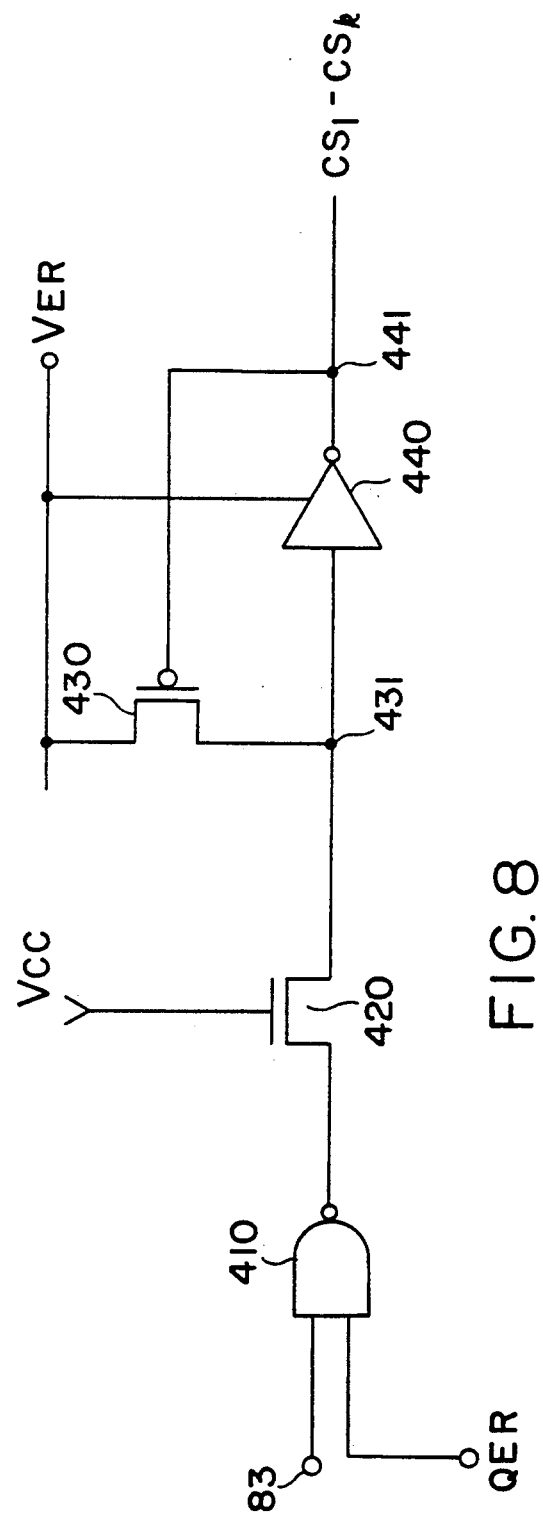
FIG. 8 is an erase selection circuit diagram according to the present invention.

FIG. 8 shows the inner circuit diagram of the erasing selection circuit 400 illustrated in FIG. 6 and FIG. 7.

The erasing selection circuit 400 includes:

a logic gate 410 whose two input terminals are supplied with an erasing enable clock signal QER and a signal 83 from the column address decoder 200, for outputting a signal for allowing erase operation;

a pass transistor 420 with its gate connected to the terminal of power source voltage and its source connected to the output terminal of the logic gate 410, for passing the output of the logic gate 410 without degradation;

gating means 440 for providing the erasing voltage VER to one of the common source lines $CS_1$-$CS_k$ in FIG. 6 or FIG. 7 only when erasing is allowed by the logic gate 410; and an insulating gate field effect transistor 430, having a threshold voltage of less than zero volts for stabilizing output voltage of the gating means 440 with its gate connected to the node 441 of the gating means 440 and its source and drain connected to the node 431 and the erasing voltage supplier VER. The transistor 430 is an insulating gate field effect transistor having a threshold voltage of less than zero volts.

Figure 9:
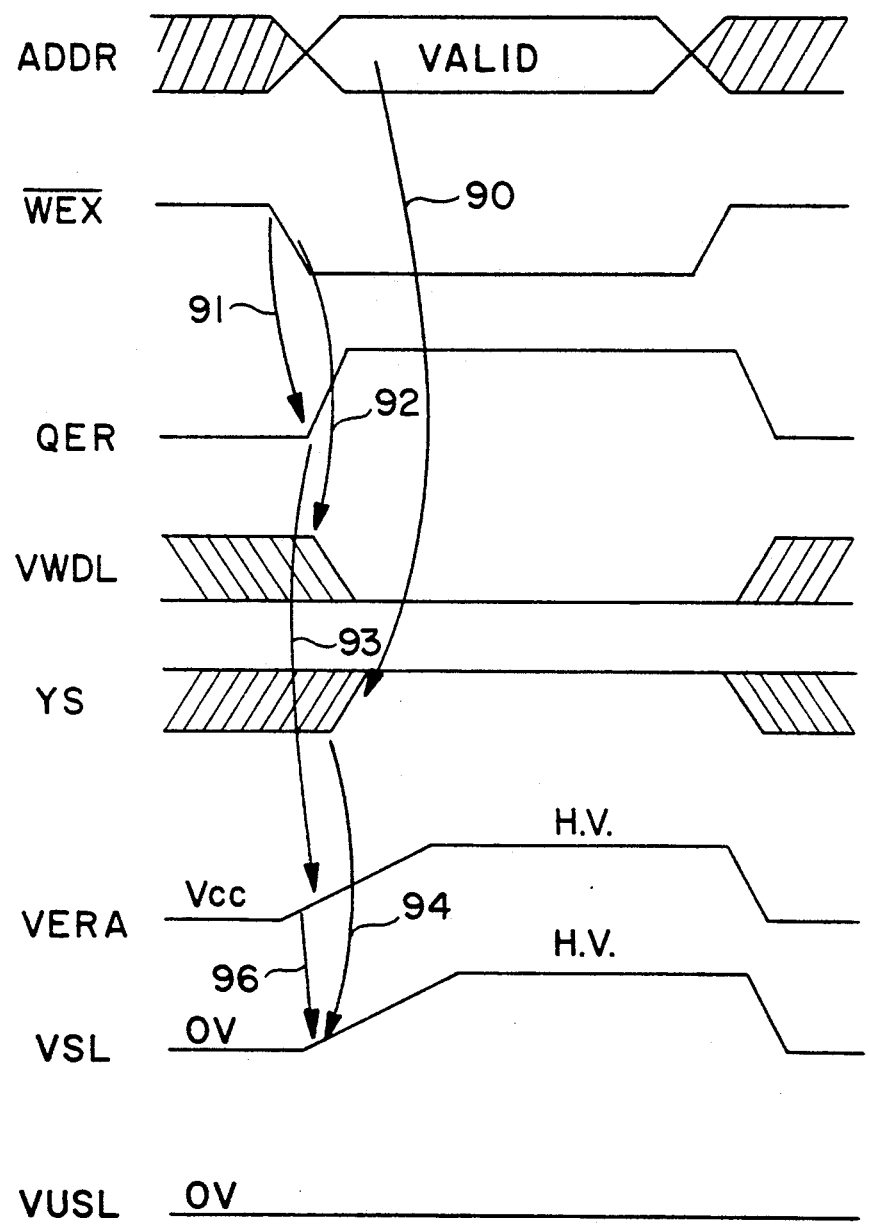
FIG. 9 is a timing diagram according to the present invention.

FIG. 9 is a timing diagram showing page erase operations according to the present invention. In FIG. 9, ADDR is a timing diagram of an outside address signal, WEX write enable signal, QER an erasing enable signal, VWDL voltage amplitude on a word line, YS a signal on a first Y gating means line Yi or a signal on a second Y gating means line Yj, VERA erasing voltage inputted in an erase selection circuit, VSL voltage amplitude of selected erasing line, VUSL voltage amplitude of an unselected erasing line. The reference numbers 90-95 in FIG. 9 are given for a better understanding of the relationship between the waveforms.

Figure 10A:
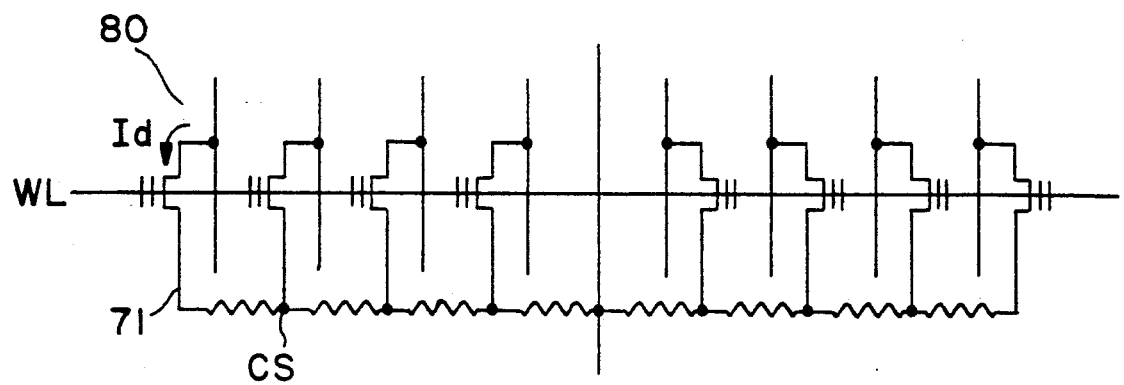
FIG. 10A is a circuit diagram showing the rising effect of grounding voltage according to the prior art.
Figure 10B:
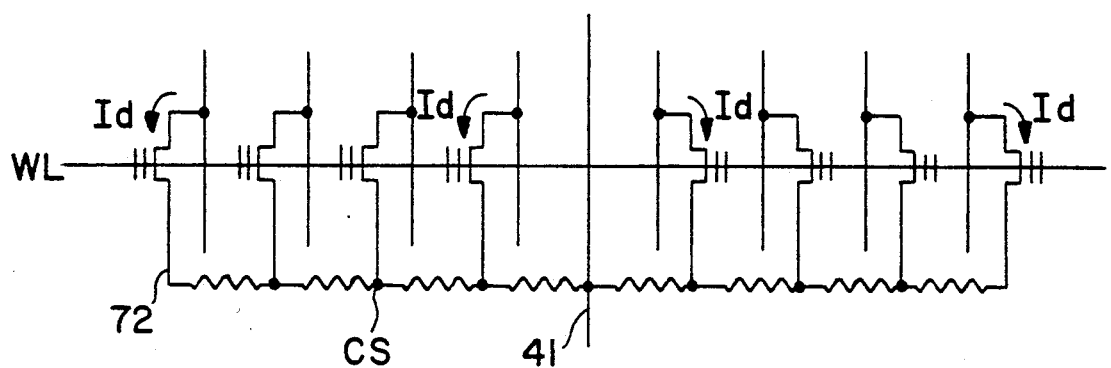
FIGS. 10B-10C are circuit diagrams showing the rising effect of grounding voltage according to the present invention.
Figure 10C:
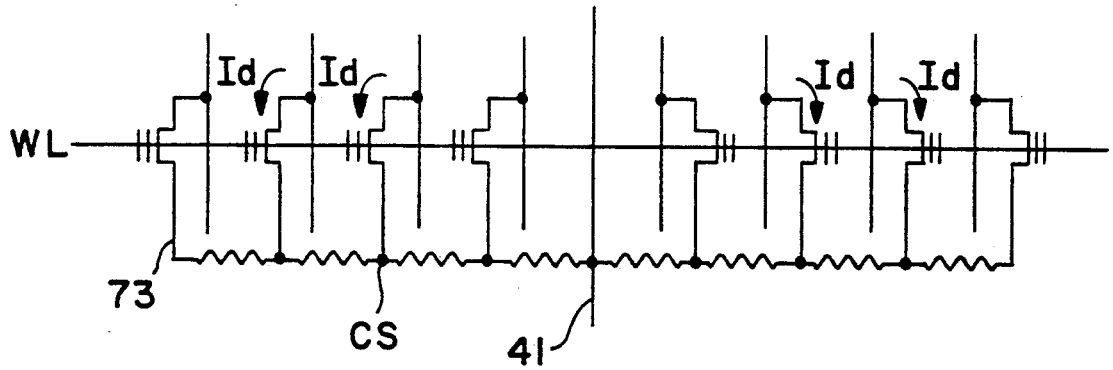

FIGS. 10B-10C are diagrams showing current flow through the cells in a row when the grounding voltage is supplied with the cells in the same row for carrying out the programming or read operation.

The present invention will now be described by referring to the abovementioned drawings.

As the structure of the arrays in FIGS. 6 and 7 is identical, except for the size of one page, the erasing and programming operations of the present invention will be described with reference to FIG. 6.

First, the erasing operation is described. The erasing operation, preceded by the programming operation, can be carried out over all of the cells in the chip as well as the cells in a selected page. The electrical erasing operation of the memory is to write a binary data "1" in the cells of the selected page or in all of the cells, while electrons of the floating gate are discharged. At this time, the drains of the cells $MC_{11}$-$MC_{K8}$ connected to all bit lines $BL_1$-$BL_8$ are in a floating state, and all the word lines $WL_1$-$WL_K$ are earthed or grounded. Here, in order to apply erasing voltage VER to the sources, the erasing selection circuit 400 which corresponds to the first page PG1 provides erasing voltage VER through the erasing line 41 with the common source lines $CS_1$-$CS_K$. The erasing operation is performed by means of applying the erasing voltage VER to the common source lines $CS_1$-$CS_K$. In this case, with Fowler Nordheim tunneling, electrons drift through a thin gate oxide layer from the floating gate 58 to the source 54 due to a high voltage of 12 volts being applied to the source 54 of FIG. 1B as stated hereinabove. The erasing operation causes the threshold voltage of the cell, which is an enhancement-type metal oxide semiconductor (EMOS) transistor, to be reduced to about 1-2 volts.

The erasing operation will be described in more detail by referring to the erasing selection circuit 400 of FIG. 8 and the timing diagram of FIG. 9. The erasing selection circuit 400 plays a role in enabling or disabling the erasing operation according to the logic states of the erasing enable clock signal QER. As seen from the circuit of FIG. 8, the gating means 440 sends the erasing voltage VER to the cells in each row through the erasing line 41 only when QER is in logic high.

In a situation that wherein the erasing mode is not required, the erasing enable clock signal is in logic low, while the write enable signal $\overline{WEX}$ of FIG. 9 is in logic high, so that the erasing voltage amplitude VERA of the erase selection circuit is maintaining a level of VCC. As the erasing enable clock signal QER is in logic low, the output of the gating means 440 is in logic low. Accordingly, the erasing line 41 is maintaining a potential 0 volts.

On the other hand, when the page erasing mode is required, that is, when the write enable signal $\overline{WEX}$ falls to a logic low level, the erasing enable clock signal QER transmits from logic low to logic high, and the voltage amplitude VWDL on the word lines $WL_{K1}$-$WL_{K4}$ is held at a logic low condition. The logic high condition of the erasing enable signal QER causes the gating means 440 to output the erasing voltage VER. However, since the Y gating means signal 83 in the unselected page is in logic low, the gating means 440 supplies a potential 0 volts to the erasing line 441. A logic low condition of the output of the gating means turns on the voltage stabilizing transistor 430, this causes the gating means 440 to keep outputting a logic low condition. When the erasing operation is performed, the erasing voltage amplitude VERA inputted to the erase selection circuit increases by 12-13 volts from a level of VCC 93 in FIG. 9. At the same time, the voltage amplitude VSL of the selected erasing line becomes a logic high by the address signal ADDR. Thus, the voltage amplitude VUSL of the selected erasing line in the selected page reaches to a high level of 12-13 volts, while the voltage amplitude VUSL of the unselected erasing line keeps a potential 0 volts. In other words, the page erasing operation is carried out over the selected page.

It will be readily understood by one skilled in the art that in the above mentioned erasing operation the pass transistor 420 provides a logic high condition to the node 431 when the output of the logic gate 410 is in logic high and makes the output of the gating means 440 to be in logic low, after that, the node 431 keeps the same logic state as a past logic high state due to the transistor 430 turned on again by the node 441 in logic low, and the pass transistor 420 is positioned between the output of the logic gate 410 and the node 431 in order to transmit the output of the logic gate 410 to the gating means 440 without degradation. On the other hand, as can be seen from FIG. 6, all of the sources are connected to the common erasing line 41 by the common source lines. Each page independently has, however, its own erasing line, so that only a selected page is erasable. Furthermore, as all of the common source lines $CS_1$-$CS_K$ are connected to the erasing line 41 in the manner of being strapped, the area of the chip can be reduced to a minimum.

Next, the programming operation of the memory will be described. As referred to above, the flash-type EEPROM device of the present invention is byte-programmable. As can be seen from the circuitry of FIG. 6, since the drains of the cells in a column are connected in common to a bit line in the same column and are not effected by the other bit lines, only the cells in a byte are selected at one time by the Y gating means YG1, that is, the byte programming is achieved. The Y gating means YG1 turning on the NMOS transistors $ST_{10}$, $ST_{22}$, $ST_{31}$, $ST_{42}$, $ST_{11}$, $ST_{21}$, $ST_{32}$, $ST_{41}$ coupled their gates to the selection lines Yi, Yj from the column address decoder 200, causes inputted data from the data lines $DL_1$, $DL_2$, $DL_3$, $DL_4$ to get into the bit lines $BL_1$, $BL_4$, $BL_5$, $BL_8$ or bit lines $BL_2$, $BL_3$, $BL_6$, $BL_7$ which are respectively connected to the NMOS transistors. When the signal of the first selection line Yi is in logic high and the signal of the second selection line Yj is in logic low, the four NMOS transistors $ST_{10}$, $ST_{22}$, $ST_{31}$, $ST_{42}$ whose gates are coupled in common to the first selection line Yi are turned on and the cells $MC_{11}$-$MC_{K1}$, $MC_{14}$-$MC_{K4}$, $MC_{15}$-$MC_{K5}$, $MC_{18}$-$MC_{K8}$ whose drains are connected to the bit lines $BL_1$, $BL_4$, $BL_5$, $BL_8$ are programmable.

Conversely, when the signal of the first selection line Yi is in logic low and the signal of the second selection line Yj is in logic high, the remaining four NMOS transistors $ST_{11}$, $ST_{21}$, $ST_{32}$, $ST_{41}$ whose gates are coupled in common to the second selection line Yj are turned on, and the memory cells $MC_{12}$-$MC_{K2}$, $MC_{13}$-$MC_{K3}$, $MC_{16}$-$MC_{K6}$, $MC_{17}$-$MC_{K7}$ whose drains are connected to the bit lines $BL_2$, $BL_3$, $BL_6$, $BL_7$ are programmable. At this time, a high voltage of about 12 volts is applied to the control gate 60 of the programmed memory cell through the word line connected thereto, and the source 54 is grounded due to the erasing selection signal with a ground potential. Then, the hot electrons remaining in the channel region 64 are injected into the floating gate 58 by means of the avalanche break down, this causes the threshold voltage of the cell to be 6-7 volts, In other words, binary data "0" are written in the selected bit lines.

The reading operation is achieved by applying a potential of 5 volts to the control gate 60 and a potential of 1.5 volts to the drain 56. At this time, current flows to the sources 54 from the drains 56 of the erased cell or the programmed cell through the channel. The array of EEPROM cells illustrated in FIG. 7 is a circuit diagram when it has sixteen column lines (or bit lines) per a page. Each of the I/O lines $I/O_1$, $I/O_2$, $I/O_3$, $I/O_4$ diverges into four lines. and the diverged sixteen I/O lines correspond respectively to the sixteen bit lines $BL_1$-$BL_{16}$. The Y gating means YG1 has four selection lines Yi, Yj, Yk, Yl, and the erasing line 41 is divided into two. These two erasing lines are connected in common to the common source lines $CS_1$-$CS_K$ with one of the two lines positioned between the two bit lines $BL_4$ and $BL_5$, the other positioned between the bit lines $BL_{12}$, $BL_{13}$.

The erasing and programming operations in the memory array of FIG. 7 are the same as those in the memory array of FIG. 6. FIGS. 6 and 7 show that the arrangement of I/O terminals (or lines) in the cell array of the present invention is quite peculiar compared with memory arrays of conventional invention. In FIG. 6, the two bit lines are assigned to one I/O terminal. Therefore, the eight bit lines BL1-BL8 are coupled to the four I/O terminals by two bit lines an I/O terminal. If the signal of the first selection line Yi is held at a high potential during programming, the bit lines $BL_1(I/O_1)$, $BL_4(I/O_2)$, $BL_5(I/O_3)$, $BL_8(I/O_4)$ are selected. If the signal of the second selection line Yj is held at a high potential, the bit lines $BL_2(I/O_1)$, $BL_3(I/O_2)$, $BL_6(I/O_3)$, $BL_7(I/O_4)$ are selected.

In FIG. 7, however, each of the I/O terminals $I/O_1$, $I/O_2$, $I/O_3$, $I/O_4$ diverges into four lines. If the signal of the first selection line Yi is held at a high potential during programming, the bit lines $BL_1(I/O_1)$, $BL_5(I/O_2)$, $BL_9(I/O_3)$, $BL_{13}(I/O_4)$ are selected. If the signal of the second selection line Yj is held at a high potential, the bit lines $BL_2(I/O_1)$, $BL_6(I/O_2)$, $BL_{10}(I/O_3)$, $BL_{14}(I/O_4)$ are selected. If the signal of the third selection line Yk is held at a high potential, the bit lines $BL_3(I/O_1)$, $BL_7(I/O_2)$, $BL_{11}(I/O_3)$, $BL_{15}(I/O_4)$ are selected. If the signal of the fourth selection line Yl is held at a high potential, the bit lines $BL_4(I/O_1)$, $BL_8(I/O_2)$, $BL_{12}(I/O_3)$, $BL_{16}(I/O_4)$ are selected. In other pages $PG_2$-$PG_{2N}$ as well as the first page $PG_1$ illustrated by example, I/O terminals are also arranged in the same manner.

It is known from the arrangement of the I/O terminals that the I/O terminals (or bit lines) in one page are selected in balance when the programming operation is carried out. Regarding the effect and the result of the operation according to the arrangement of the I/O terminals, a detailed explanation thereof will be given by referring to FIG. 10A-10C. FIG. 10A illustrates the arrangement of I/O terminals under the prior art when the programming operation is carried out. FIG. 10B and FIG. 10C illustrate respectively the relationship between the signal of the first selection line Yi in logic high and the signal of the second selection line Yj in logic high in FIG. 6.

In FIGS. 10A-10C, the resistances R positioned between the sources of the cells are parasitic resistance components which are induced by is the source 54 of the cell is connected in common to the sources of the neighboring cells through the source diffusion region 52. In FIG. 10A, the grounding voltage which is applied to the node 71 is 4RxId volts when the first cell is selected by the first bit line BL1.

In the present invention, however, the four cells are selected by current Id flowing through, the four I/O lines of the eight I/O lines, as illustrated in FIGS. 10B and 10C. In this case, the grounding voltage at the node 72 of FIG. 10B is increased to 5RxId volts by adding a voltage of 4RxId volts due to the current Id flowing through the cell on the first I/O line $I/O_1$ together with the voltage RxId volts being applied to by the current through the cell on the fourth I/O line $I/O_2$. The grounding voltage which is applied to the node 73 of FIG. 10C is also 5RxId volts due to the voltage 3RxId volts being applied to the second I/O line $I/O_1$ and the voltage 2RxId volts being applied to the third I/O line $I/O_2$. Although the grounding voltage of the present invention is higher than the conventional grounding voltage, it does not create a great problem for the programming or reading operations of the memory.

In an embodiment of the present invention, the I/O terminal arrangement method is described by a graphic representation given in FIGS. 6 and 7, but other embodiments will also be available, wherein I/O terminals are arranged so as to minimize the grounding voltage of the present invention.

As hitherto described, the present invention has an advantage in that it promotes stabilization of the operation of the chip by means of minimizing the grounding voltage caused by the source current of the cells when the programming operation is carried out according to the present arrangement of I/O terminals.

The present invention has another advantage in that it is not merely able to erase only such a page a desired by the user by installing one erasing selection line in a page, but it is also able to achieve byte-programming within the erased page by connecting the drains of memory cells in each column to each of the different I/O terminals (or bit lines), so that they may be isolated from the drains in other columns.

The present invention has still another advantage in that it reduces excessive erasing threshold voltage which is caused by the erasing operation of all of the cells in a chip at one time, since the respective erasing selection circuits are connected to the respective pages, each page maintains a proper erasing threshold voltage.

The present invention has further advantage in that it has a memory array which causes the chip area to be minimized by strapping the erasing lines and the common source lines.

Thus, in the EEPROM device, the present invention is effective in that it not only reduces excessive erasing voltage caused by the erasing operation and provides the user with the diverse operation ranges, but also extends the operation margin of the EEPROM by minimizing the earthing voltage of the programming operation of the present invention.

Although specific constructions and procedures of the invention have been illustrated and described herein, it is not intended that the invention be limited to the elements and constructions disclosed. One skilled in the art will easily recognize that the particular elements or subconstructions may be used without departing from the scope and spirit of the invention.

What is claimed is:

1. An electrically erasable and programmable semiconductor memory device with a memory cell array including a plurality of pages, each of said pages having a plurality of word lines, a plurality of bit lines, and a plurality of floating gate transistors, wherein drains of said floating gate transistors in a column are connected in common to one of said bit lines, and wherein control gates of said floating gate transistors in a row are connected in common to one of said word lines, comprising:

a plurality of erasing selection circuits, respectively connected to each one of said pages, for supplying an erasing voltage to only a selected pages, wherein each of said erasing selection circuits comprises:
  a logic gate for outputting a logic signal by inputting both a signal from a column address decoder and an erasing enable clock signal;
  passing means for passing the logic signal from said logic gate without degradation;
  gating means having one input terminal for receiving said logic signal passed by said passing means and one output terminal for supplying said erasing voltage only when said logic signal is in a logic low state;
  voltage stabilizing means, connected to the input terminal of said gating means and the output terminal of said gating means and an erasing voltage supplying terminal, for stabilizing said erasing voltage supplied by said gating means; and
  an erasing line for applying said erasing voltage from said gating means to sources of each of said floating gate transistors.

2. The electrically erasable and programmable semiconductor memory device of claim 1, wherein said selection circuits' lines are connected to respective ones of said pages.

3. The electrically erasable and programmable semiconductor memory device of claim 1, wherein said voltage stabilizing means is an insulating gate field effect transistor having a threshold voltage of less than zero volts.

4. The electrically erasable and programmable semiconductor memory device of claim 1, wherein said erasing enable clock signal is raised to logic high when erasing operation is required.

5. An electrically erasable and programmable semiconductor memory device with a memory cell array including a plurality of pages, said each page having a plurality of word lines, a plurality of bit lines, and a plurality of floating gate transistors, wherein drains of said floating gate transistors in a column are connected in common to one of said bit lines, and wherein control gates of said floating gate transistors in a row are connected in common to one of said word lines, comprising:
  one input/output line decoded by a column address decoder and connected in common to said bit lines within said each page; and
  a plurality of erasing selection circuits connected respectively to each page for outputting an erasing voltage required to erase cells in a selected page, wherein each of said erasing selection circuits comprises:
    a logic gate for outputting a logic signal by inputting both a signal from a column address decoder and an erasing enable clock signal;
    passing means for passing the logic signal from said logic gate without degradation;
    gating means having one input terminal for receiving said logic signal passed by said passing means and one output terminal for supplying said erasing voltage only when said logic signal is in a logic low state;
    voltage stabilizing means, connected to the input terminal of said gating means and the output terminal of said gating means and an erasing voltage supplying terminal, for stabilizing said erasing voltage supplied by said gating means; and
    an erasing line for applying said erasing voltage from said gating means to sources of each of said floating gate transistors.

6. The electrically erasable and programmable semiconductor memory device of claim 5, wherein said selection circuits' erasing lines are connected to respective ones of said pages.

7. The electrically erasable and programmable semiconductor memory device of claim 5, wherein said voltage stabilizing means is an insulating gate field effect transistor having a threshold voltage of less than zero volts.

8. The electrically erasable and programmable semiconductor memory device of claim 5, wherein said erasing enable clock signal is raised to logic high when erasing operation is required.

9. An electrically erasable and programmable semiconductor memory device with a memory cell array including a plurality of pages, each of said pages having a plurality of word lines, a plurality of bit lines, and a plurality of floating gate transistors, wherein drains of said floating gate transistors in a column are connected in common to one of said bit lines, and wherein control gates of said floating gate transistors, in a row, are connected in common to one of said word lines, comprising:
  a plurality of input/output lines selected by a column address decoder, each of said input/output lines connected in common to several of said bit lines within each of said pages; and
  a plurality of erasing selection circuits connected respectively to each of said pages for outputting an erasing voltage required to erase cells of a selected page, wherein each of said erasing selection circuits comprises:
    a logic gate for outputting a logic signal by inputting both a signal from a column address decoder and an erasing enable clock signal;
    passing means for passing the logic signal from said logic gate without degradation;
    gating means having one input terminal for receiving said logic signal passed by said passing means and one output terminal for supplying said erasing voltage only when said logic signal is in a logic low state;
    a voltage stabilizing means, connected to the input terminal of said gating means and the output terminal of said gating means and an erasing voltage supplying terminal, for stabilizing said erasing voltage supplied by said gating means; and
    an erasing line for applying said erasing voltage from said gating means to sources of each of said floating gate transistors.

10. The electrically erasable and programmable semiconductor memory device of claim 9, wherein said erasing line of each of said erasing selection circuits is connected to a respective one of said pages.

11. The electrically erasable and programmable semiconductor memory device of claim 9, wherein said voltage stabilizing means is an insulating gate field effect transistor having a threshold voltage of less than zero volts.

12. The electrically erasable and programmable semiconductor memory device of claim 9, wherein said erasing enable clock signal is raised to logic high when erasing operation is required.

13. An array of electrically erasable and programmable semiconductor memory device cells, comprising:
floating gate transistors having sources, drains and control gates, arranged in rows and columns;
a plurality of word lines, said each word line being connected in common to said control gates in corresponding rows;
a plurality of bit lines divided into a first group and a second group, said each bit line being connected in common to said drains in corresponding columns;
an erasing line connected to each of said sources;
first selection means for selecting said first group and writing or reading contents of first ones said transistors, wherein said first ones of said transistors are connected to said bit lines of said first group;
second selection means for selecting said second group and writing or reading contents of second ones of said transistors, wherein said second ones of said transistors are connected to said bit lines of said second group; and
an erasing selection circuit for supplying an erasing voltage to each of said sources through said erasing line, wherein said erasing selection circuit comprises:
a logic gate for outputting a logic signal by inputting both a signal from a column address decoder and an erasing enable clock signal;
passing means for passing the logic signal from said logic gate without degradation;
gating means having one input terminal for receiving said logic signal passed by said passing means and one output terminal for supplying said erasing voltage only when said logic signal is in a logic low state;
voltage stabilizing means connected to the input terminal of said gating means and the output terminal of said gating means and an erasing voltage supplying terminal, for stabilizing said erasing voltage supplied by said gating means.

14. The array of electrically erasable and programmable semiconductor memory device cells of claim 13, wherein said bit lines of said first group and said second group are connected respectively to a plurality of input/output terminals.

15. The array of electrically erasable and programmable semiconductor memory device cells of claim 13, wherein said voltage stabilizing means is an insulating gate field effect transistor having a threshold voltage of less than zero volts.

16. The array of electrically erasable and programmable semiconductor memory device cells of claim 13, wherein said erasing enable clock signal is raised to logic high when erasing operation is required.

* * * * *

UNITED STATES PATENT AND TRADEMARK OFFICE
CERTIFICATE OF CORRECTION

PATENT NO. : 5,109,361

DATED : 28 April 1992

INVENTOR(S) : Hyeong-Kyu YIM, et al.

It is certified that error appears in the above-identified patent and that said Letters Patent is hereby corrected as shown below:

Column 1, Line 52, delete "the".

Column 3, Line 5, delete "the" (second occurrence).

Column 6, Line 38, insert a comma after "volts".

Column 7,

Column 9, Line 14, replace "invention" with --inventions--;

Line 55, delete "is";

Line 56, delete "is"; and

Line 68, delete "to".

Column 10, Line 23, replace "a" (second occurrence) with --as--;

UNITED STATES PATENT AND TRADEMARK OFFICE
CERTIFICATE OF CORRECTION

PATENT NO. : 5,109,361

DATED : 28 April 1992

INVENTOR(S) : Hyeong-Kyu YIM, et al.

It is certified that error appears in the above-identified patent and that said Letters Patent is hereby corrected as shown below:

<u>IN THE CLAIMS</u>

Column 10, Line 67, replace "pages" with --page--.

Column 11,

Line 40, delete "said floating gate transistors in a column are connected";

Line 41, delete "in common to one of said bit lines, and wherein control"; and

Signed and Sealed this

Twenty-seventh Day of September, 1994

Attest:

BRUCE LEHMAN

Attesting Officer     *Commissioner of Patents and Trademarks*